(12) United States Patent
Yang et al.

(10) Patent No.: US 7,725,800 B2
(45) Date of Patent: May 25, 2010

(54) DECODING TECHNIQUES FOR CORRECTING ERRORS USING SOFT INFORMATION

(75) Inventors: Shaohua Yang, San Jose, CA (US); Richard Leo Galbraith, Rochester, MN (US); Ksenija Lakovic, San Jose, CA (US); Yuan Xing Lee, San Jose, CA (US); Travis Oenning, Rochester, MN (US); Jongseung Park, Rochester, MN (US); Hideki Sawaguchi, Sunnyvale, CA (US); Bruce A. Wilson, San Jose, CA (US)

(73) Assignee: Hitachi Global Stroage Technologies Netherlands, B.V., Amsterdam (NL)

( * ) Notice: Subject to any disclaimer, the term of this patent is extended or adjusted under 35 U.S.C. 154(b) by 941 days.

(21) Appl. No.: 11/198,945

(22) Filed: Aug. 5, 2005

(65) Prior Publication Data

US 2007/0044006 A1 Feb. 22, 2007

(51) Int. Cl.
*H03M 13/00* (2006.01)
*H03M 13/03* (2006.01)
(52) U.S. Cl. .................. 714/755; 714/794; 714/795
(58) Field of Classification Search ............... 714/755, 714/794, 795
See application file for complete search history.

(56) References Cited

U.S. PATENT DOCUMENTS

| | | | | |
|---|---|---|---|---|
| 4,364,081 A * | 12/1982 | Hashimoto et al. | ........... | 348/617 |
| 4,833,679 A * | 5/1989 | Anderson et al. | ............ | 714/758 |
| 4,845,714 A * | 7/1989 | Zook | ............ | 714/755 |
| 5,457,704 A * | 10/1995 | Hoeher et al. | ............ | 714/794 |
| 5,875,199 A * | 2/1999 | Luthi | ............ | 714/780 |
| 6,029,264 A * | 2/2000 | Kobayashi et al. | ............ | 714/755 |
| 6,052,248 A * | 4/2000 | Reed et al. | ............ | 360/53 |
| 6,161,209 A * | 12/2000 | Moher | ............ | 714/780 |
| 6,185,175 B1 * | 2/2001 | Zook | ............ | 369/53.35 |
| 6,405,342 B1 * | 6/2002 | Lee | ............ | 714/792 |
| 6,513,141 B1 * | 1/2003 | Livingston | ............ | 714/792 |
| 6,516,443 B1 * | 2/2003 | Zook | ............ | 714/792 |
| 6,530,060 B1 * | 3/2003 | Vis et al. | ............ | 714/792 |
| 6,604,220 B1 * | 8/2003 | Lee | ............ | 714/769 |
| 6,662,338 B1 | 12/2003 | Rezzi et al. | | |
| 6,694,477 B1 * | 2/2004 | Lee | ............ | 714/784 |

(Continued)

OTHER PUBLICATIONS

U.S. Appl. No. 11/198,943, filed Aug. 5, 2005, Yang et al.

(Continued)

*Primary Examiner*—Joseph D Torres
(74) *Attorney, Agent, or Firm*—Steven J. Cahill

(57) ABSTRACT

Two levels of error correction decoding are performed using first and second level decoders. A composite code formed by combining an inner component code and an outer component code can be used to decode the data and correct any errors. Performing two level decoding using a composite code allows the size of the inner parity block to be reduced to a single Reed-Solomon symbol while keeping a good code rate. The first level decoder generates soft information. The soft information can indicate a most likely error event for each possible syndrome value of the inner component code. The soft information can also include error metric values for each of the most likely error events. The second level decoder generates corrected syndrome values based on the soft information using the outer component code. The most likely trellis path that corresponds to the corrected syndrome values is then selected.

8 Claims, 3 Drawing Sheets

U.S. PATENT DOCUMENTS

| | | | |
|---|---|---|---|
| 6,708,308 | B2 | 3/2004 | De Souza et al. |
| 6,757,117 | B1 | 6/2004 | Livingston |
| 6,757,122 | B1 | 6/2004 | Kuznetsov et al. |
| 6,888,897 | B1 | 5/2005 | Nazari et al. |
| 6,981,201 | B2 * | 12/2005 | Reggiani et al. ............ 714/786 |
| 6,986,098 | B2 * | 1/2006 | Poeppelman et al. ........ 714/807 |
| 7,096,400 | B2 * | 8/2006 | Lim et al. .................... 714/748 |
| 7,421,642 | B2 * | 9/2008 | Williamson et al. ......... 714/785 |
| 2002/0147954 | A1 | 10/2002 | Shea |
| 2003/0033570 | A1 | 2/2003 | Khannanov et al. |
| 2003/0043487 | A1 | 3/2003 | Morita et al. |
| 2003/0074626 | A1 | 4/2003 | Coker et al. |
| 2003/0174426 | A1 | 9/2003 | Akamatsu |
| 2004/0064777 | A1 | 4/2004 | Kurtas et al. |
| 2004/0187066 | A1 | 9/2004 | Ichihara et al. |
| 2004/0201503 | A1 | 10/2004 | Han et al. |
| 2004/0205383 | A1 | 10/2004 | Sawaguchi |
| 2005/0062623 | A1 | 3/2005 | Lee et al. |
| 2005/0066261 | A1 | 3/2005 | Morita et al. |

OTHER PUBLICATIONS

Panu Chaichanavong, et al., "A Tensor Product Parity Code for Magnetic Recording," Center for Magnetic Recording Research, University of California, San Diego, Jul. 21, 2004, pp. 1-25.

Panu Chaichanavong, et al., "Combining a Tensor-Product Parity Code with a Constrained Code," Center for Magnetic Recording Research, University of California, San Diego, Mar. 1, 2005, pp. 1-33.

Panu Chaichanavong et al., "A Tensor Product Parity Code for Magnetic Recording," CMRR Report, Summer 2004, pp. 4-5.

Panu Chaichanavong, et al., "A Tensor Product Parity Code for Magnetic Recording," http://vivaldi. ucsd.edu:8080/starpapers/Chaichanavong-UP04.pdf, pp. 1-3.

Roy D. Cideciyan, et al., "Noise Predictive Maximum Likelihood Detection Combined with Parity-Based Post-Processing," IEEE Transactions on Magnetics, vol. 37, No. 2, Mar. 2001, pp. 714-720.

Thomas Conway, "A New Target Response with Parity Coding for High Density Magnetic Recording Channels," IEEE Transactions on Magnetics, vol. 34, No. 4, Jul. 1998, pp. 2382-2386.

Ajay Dholakia, et al., "Capacity-Approaching Codes for the Magnetic Recording Channel," IBM Research Report, Oct. 28, 2002.

Hideki Imai, et al., "Generalized Tensor Product Codes," IEEE Transactions on Information Theory, vol. IT-27, No. 2, Mar. 1981, pp. 181-187.

Z. A. Keirn, et al., "Use of Redundant Bits for Magnetic Recording: Single-Parity Codes and Reed-Solomon Error Correcting Code," IEEE Transactions on Magnetics, vol. 40, No. 1, Jan. 2004, pp. 225-230.

Mauro Lattada, et al., "Improving DVB-T Forward Error Correction by Concatenated Turbo Code Scheme," from http://www.polytech.univ-nantes.fr/pv2003/papers/pv/papers/cr1040.pdf.

Alberto Torres, et al., "Inclusion of Concatenated Convolutional Codes in the ANSI T1.413 Issue 3," http://www.vocal.com/white_paper/t1e1301.pdf, Nov. 30-Dec. 4, 1998, pp. 1-12.

Alberto Torres, et al., Comparison of Simulated Results for Different Coding Techniques(Uncoded, Reed-Solomon, Reed-Solomon plus Trellis and Reed-Solomon plus Parallel Concatenated Convolutional Codes) for G.992.1 bis and G.992.2.bis, ITU—Telecommunication Standardization Sector, May 10-14, 1999.

Jun Xu, et al., "On Products of Graphs for LDPC Codes," Information Theory Workshop 2003, Paris, France, Mar. 31-Apr. 4, 2003, pp. 6-9.

J. K. Wolf, "Error-Locating Codes- A New Concept in Error Control," IEEE Transactions on Information Theory, 1963, pp. 113-117.

J. K. Wolf, "On Codes Derivable from the Tensor Product of Check Matrices," IEEE Transactions on Information Theory, 1965, pp. 281-284.

* cited by examiner

DECODING TECHNIQUES FOR CORRECTING ERRORS USING SOFT INFORMATION

FIELD OF THE INVENTION

The present invention relates to techniques for performing error correction decoding in data recording systems, and more particularly, to techniques for performing error correction using decoders that process soft information.

BACKGROUND OF THE INVENTION

When a data sequence is read from a magnetic hard disk using a hard disk drive, the data sequence can be estimated by running the signal samples at the output of the channel through a trellis sequence detector. The trellis sequence detector computes a most likely input sequence associated with the signal samples. The most likely input sequence is the sequence through a trellis that is closest to the signal samples in Euclidean space.

A trellis diagram represents a time sequence of sample values and the possible recorded input sequences that could have produced the sample sequence. A Viterbi detector is a trellis sequence detector that finds the most likely trellis path among all possible trellis paths in a trellis diagram based on a metric value associated with each trellis path.

When a long parity code is used, it becomes very complex to implement a Viterbi detector so as to enforce the parity code constraints along the trellis, because the number of trellis states of the Viterbi detector increases exponentially with the number of parity bits in the parity code.

A parity post processor (PPP) is a signal processing module added to a conventional Viterbi detector to enforce a parity code constraint and/or to re-compute more accurate trellis path metric values based on a longer target polynomial than the one used by the Viterbi detector. Among all the trellis paths that the PPP evaluates, the PPP picks the trellis path that also satisfies the parity constraint and makes corrections to the Viterbi output accordingly.

FIG. 1 illustrates an example of a decoding system that includes a parity post processor (PPP). The decoding system receives a stream of equalized samples. The equalized samples are generated from an equalizer (not shown) based on a read sequence from a magnetic disk. A Viterbi detector 102 outputs the most likely trellis path.

Synthetic waveform block 106 remodulates the output of Viterbi detector 102 into an estimated sequence of ideal sample values. An adder 108 subtracts these ideal sample values from a delayed version of the equalized samples to generate a sequence of sample error values. The sample error values represent the noise in the read sequence. Delay block 104 accounts for the delay of detector 102 to ensure that corresponding blocks of data are received at both inputs of adder 108 at the same time.

Two paths through the trellis that differ in a single bit, differ in multiple sample values. Filter 110 filters the sample error values to compute the difference in the metric values between the detected path through the trellis and a path that differs by a single bit.

The output of Viterbi detector 102 is passed through a delay block 114 to error event pattern matching block 120 as the preliminary detected binary sequence. Block 120 attempts to match a predefined set of error events to the preliminary detected binary sequence. The predefined error events represent the most likely error events. They are a subset of all of the possible error events.

Block 120 analyzes each set of bits in a sliding window. The sliding window moves across each codeword, as shown in FIG. 1. In this example, there are 10 bits in each codeword. The illustrative error event shown in block 120 is an alternating error affecting five data bits. This error is denoted +-+-+ and corresponds to a recorded binary sequence . . . WXYZ01010ABCD . . . being incorrectly detected as . . . WXYZ10101ABCD . . . where ABCDWXYZ can each take values of one or zero and are detected correctly.

This error event can only occur if the detected data contains a string of five alternating bit values 10101 or 01010. Therefore, a sliding window of five bits is examined, and the error event is declared valid with positive sign if the detected data in the window is 10101 and valid with negative sign if it is 01010. When an error event occurs near the edge of a codeword, bits in an adjacent codeword must be examined in order to qualify the error event.

Error event pattern matching block 120 generates a valid signal that indicates which of the predefined error events matches the bits in each sliding window. If block 120 indicates that a particular error event is valid for the bits within a sliding window, block 112 causes an error pattern correlator to correlate the sample error values from block 110 with that valid error event. Block 112 generates error metric values that indicate the likelihood that each valid error event is the correct one. An error metric indicates a probability that a set of the sample error values is caused by a particular error event.

Error event pattern matching block 120 also determines the sign of the error event. The error event sign is multiplied by the output of the error pattern correlator to correct the sign of the error event in block 112.

Error event pattern matching block 120 also generates a threshold value. The threshold value is an offset value that is derived from evaluating the trellis path of an error event. The threshold value varies in response to the bits that are next to the error bits. The threshold value is subtracted from the sign-corrected output of the error correlator to generate an error metric in block 112. Block 112 generates an error metric value for each valid error event that matches bits within any of the sliding windows.

Error event pattern matching block 120 also computes the syndrome value for each valid error event using a parity check equation. There are 2 possible syndrome values, 1 and 0.

Most likely error event generator block 130 selects the error event that has the smallest error metric value and a syndrome value of 1 as the most likely error event. A preliminary detected binary sequence that has a syndrome of 1 (i.e., odd parity) is indicative of an error in the codeword.

Error correction is then applied to the preliminary detected binary sequence to correct the error based on the most likely error event selected in block 130, which includes the error location and the error event type. The PPP of FIG. 1 does not consider error events that generate syndromes with even parity (i.e., a syndrome value of 0), even though many error events do not change the parity value of blocks.

Hard-decision decoding takes binary bits as input, assumes all bits are equally likely to be in error, and decodes by flipping as few bits as possible to produce a valid codeword. Hard decoding uses special algebraic properties of the code to decode efficiently, even for very powerful codes.

One type of two-stage decoder uses a hard-decoded tensor product code, where the second component code of the tensor product code is a hard-decoded BCH code. Reed Solomon ECC decoding is another example of hard-decision decoding. Because hard decision decoding assumes all bits are equally likely to be in error, it does not consider that some bits are more reliable than others.

Error correction can also be performed by soft-decision decoding. Soft-decision decoding receives input analog data (e.g., an equalized read-back signal or bit reliability information) and preferentially flips unreliable bits. Soft-decision decoding out-performs hard-decision decoding, because it is able to exploit the fact that some bits are more reliable than others.

However, it can be difficult to decode powerful codes efficiently using soft decoding. Also, existing soft-decoded parity codes span multiple Reed-Solomon (RS) symbols. Therefore, it would be desirable to provide error correction decoding techniques with greater performance and reliability.

BRIEF SUMMARY OF THE INVENTION

The present invention includes systems and methods for error correction decoding. Two levels of error correction decoding are performed using a first level decoder and a second level decoder. A composite code formed by combining an inner component code and an outer component code can be used to decode the data and correct any errors. Performing two level decoding using a composite code allows the size of the inner parity block to be reduced to a single Reed-Solomon (RS) symbol while keeping a good code rate.

The first level decoder generates soft information. The soft information can indicate a most likely error event for each possible syndrome value of the inner component code. The soft information can also include error metric values for each of the most likely error events.

The second level decoder generates corrected syndrome values based on the soft information using the outer component code. The most likely trellis path that corresponds to the corrected syndrome values is then selected. The present invention represents a substantial improvement over many prior art techniques, because it allows soft decoding of the outer component code.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
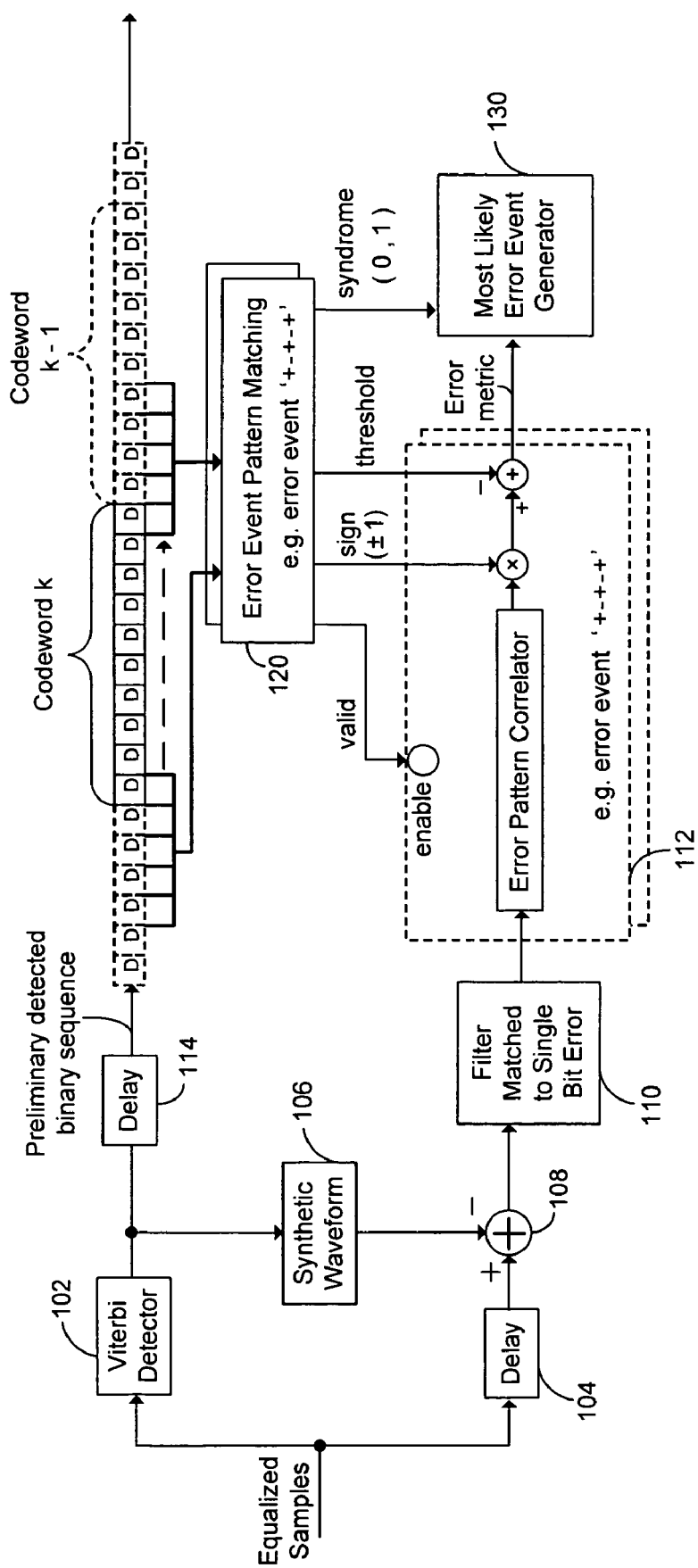
FIG. 1 illustrates an example of a prior art parity post processor.

In many data storage or communications systems, two separate codes are combined to form a composite code. The most common method of combining two component codes is simple concatenation. In simple concatenation, the composite codeword consists of a sequence of smaller blocks. Each of the smaller blocks is a codeword of an inner component code. The sequence of blocks is a codeword of an outer component code. Simple concatenation combines two component codes to form a composite code that has stronger error correcting capabilities than either component code. However, the composite code incurs the parity overhead of both component codes.

Encoding proceeds by first encoding the data blocks using the outer component code by adding outer parity blocks. Then, every block is encoded using the inner component code by adding inner parity bits within each block.

Decoding proceeds by first decoding each block using the inner component code decoder. The inner component code decoder corrects all errors in blocks with only a few bits in error. The resulting sequence of blocks is then decoded using the outer component code decoder. The outer component code decoder corrects blocks that were decoded incorrectly by the inner component code decoder.

Another method for combining two component codes known in the prior art is generalized concatenation. As with simple concatenation, the composite codeword consists of a sequence of smaller blocks. The blocks are not codewords of the inner component code. The degree to which each block deviates from the parity rules of the inner component code is called the syndrome for that block. The outer component code does not operate over the sequence of blocks as such, but rather the sequence of syndromes is a codeword of the outer component code.

Encoding proceeds by computing the inner component code syndrome for blocks corresponding to data elements of the outer component code. The outer component code encoder then computes the syndromes required for the remaining blocks in order for the complete sequence of syndromes to form a valid codeword of the outer component code. These remaining blocks correspond to parity elements of the outer component code. For the remaining blocks, parity bits are added to force the syndrome to the required value.

Decoding proceeds by first computing the inner block syndrome for each block. The sequence of syndromes is then decoded using the outer component code decoder. Each block is then decoded again using the inner component code decoder and the corresponding syndrome value given by the outer component code decoder.

According to an embodiment of the present invention, a decoder receives data encoded by combining three component codes to form a composite code. First, two codes are combined by generalized concatenation to form a first composite code. The first composite code is then used as the inner code in simple concatenation with an outermost error correction code to form a second composite code.

For example, a simple parity code can be concatenated with a BCH code to form a composite tensor product parity code that is then concatenated with a Reed-Solomon outermost error correction code. It should be understood that the principles of the present invention can decode data that has been encoded using composite codes formed by combining different component codes in a similar fashion.

Figure 2:
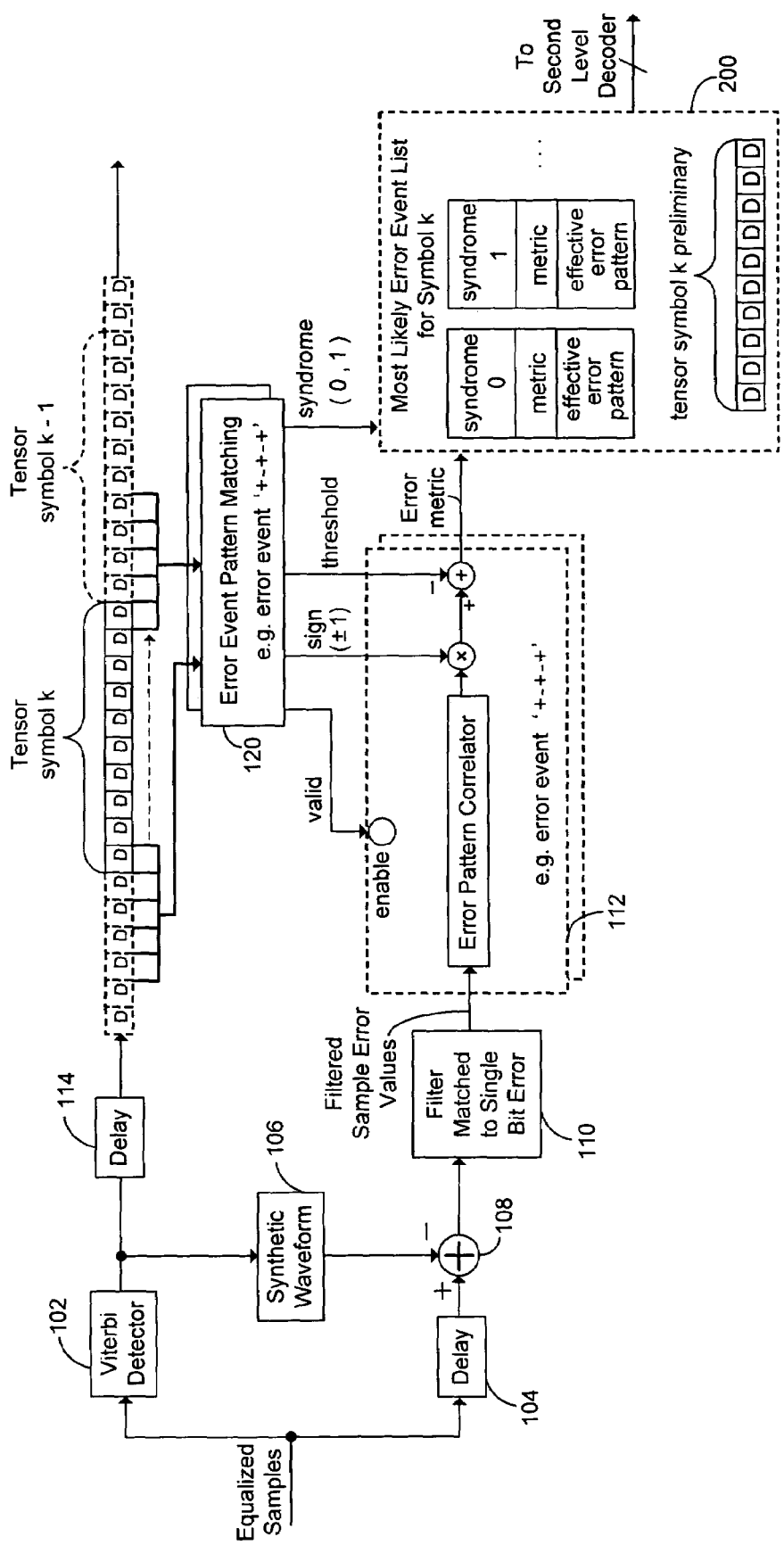
FIG. 2 illustrates an example of a parity post processor that generates soft information an according to an embodiment of the present invention.

According to the present invention, soft decoding is performed to correct errors in a data stream. FIG. 2 illustrates an example of a parity post processor of the present invention that applies soft-decision decoding to decode data encoded with a composite code.

The parity post processor (PPP) of FIG. 2 generates soft information according to an embodiment of the present invention. The PPP of FIG. 2 includes an error event pattern matching block 120 and an error metric generator block 112, which are described above with respect to FIG. 1.

In the system of FIG. 2, Viterbi detector 102 generates a series of tensor symbols. Each tensor symbol has 10 bits in the example of FIG. 2. However, it should be understood that the present invention can be used to decode symbols or codewords of any length.

The tensor symbols are encoded by a tensor product parity code. Although tensor product parity codes are used to illustrate the present invention, it should be understood that the principles of the present invention can be applied to any composite code. Tensor product parity codes are merely one type of composite codes.

Error event pattern matching block 120 analyzes bits within each tensor symbol using a sliding window. Each sliding window has 5 bits in the example of FIG. 2. The number of bits in the sliding window corresponds to the length of the error event being evaluated. It should be understood that the present invention can be used with an inner component code having any desired span and any set of likely error events.

The PPP also includes soft information generator 200. Soft information generator 200 receives the error metric values from block 112 for the valid error events that occur within each sliding window. As described above, an error metric indicates a probability that a set of the sample error values is caused by a particular error event. Soft information generator 200 also receives a syndrome value from block 120 for each of the valid error events. Thus, each error event is associated with a syndrome value and an error metric.

Most likely error event generator 200 typically receives numerous error events for each tensor symbol. As an example, generator block 200 may receive hundreds of error events for each tensor symbol.

In block 200, all of the error metrics are organized by syndrome value, and the most likely valid error event for each syndrome value is selected for each bit time, as the sliding window passes over the detected data.

Block 200 selects the error event with the minimum error metric among all of the error events that have a syndrome value of zero and that are valid for a particular span. The error event associated with that minimum error metric is the most likely error event in that span for syndrome 0.

Block 200 also selects the error event with the minimum error metric value among all of the error events that have a syndrome value of one and that are valid for a particular span. The error event associated with that minimum error metric is the most likely error event in that span for syndrome value of 1.

The end result is a set of soft information generated by block 200 for each symbol k, k−1, etc. in the preliminary detected binary sequence. The soft information includes a most likely error event matching each span of the symbol that has a 0 syndrome and a most likely error event matching each span of the symbol that has a 1 syndrome. Some error events straddle the boundary of two tensor symbols. These error events may appear as one of the most likely errors in more than one list. That error event may have different syndrome values in the two tensor symbols it overlaps.

The soft information is also referred to as reliability information. The soft information is used to select the most likely value for each tensor symbol, as will now be described in further detail with respect to FIG. 3.

Figure 3:
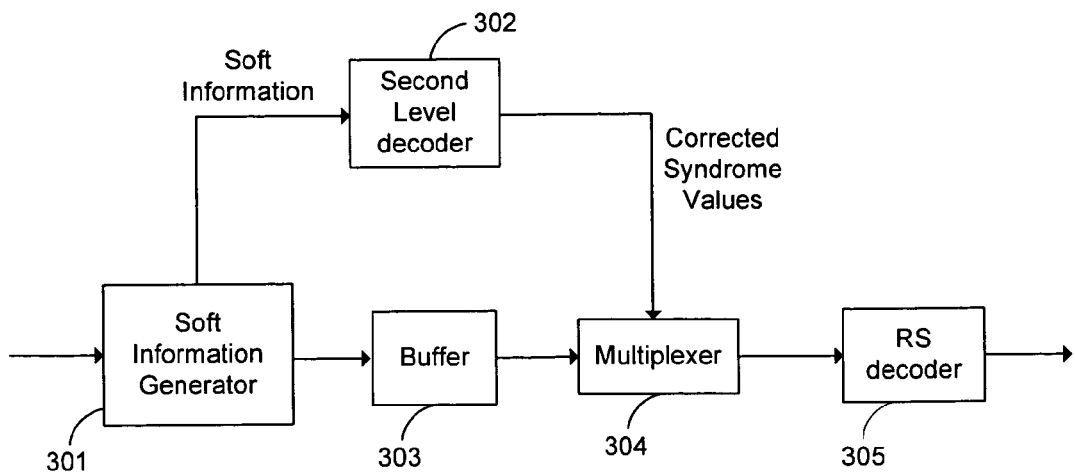
FIG. 3 illustrates an example of a two level decoding system that processes soft information according to an embodiment of the present invention.

FIG. 3 illustrates an example of a two level decoding system that selects a most likely symbol corresponding to a most likely error event, according to an embodiment of the present invention.

Soft information generator 301 is a first level decoder that generates the soft information. As described above with respect to FIG. 2, the soft information includes the mostly likely error event in each span for each possible syndrome value. The soft information also includes an error metric associated with each of the most likely error events. Soft information generator 301 can be a Viterbi detector combined with a parity post processor (as shown in FIG. 2), or a soft output Viterbi algorithm (SOVA).

According to an embodiment of the present invention, the preliminary binary detected sequence is a series of symbols generated by an encoder that encodes data using a composite code. As described above, a composite code is a combination of an inner component code and an outer component code. First level decoder 301 decodes the bits in each span using the inner component code and generates the soft information.

The soft information is transmitted to a second level decoder 302. Second level decoder 302 decodes the soft information using the outer component code. If the preliminary binary detected sequence is a series of tensor parity symbols, the second level decoder 302 decodes the soft information using a tensor product parity code.

A tensor product parity code (TPPC) is constructed by combining two smaller error correcting codes. The parity check matrix of a TPPC is derived by taking the tensor product of the parity check matrices for the two smaller codes. For example, a TPPC code can be the tensor product of a short parity code and a low density parity check (LDPC) code. The two smaller codes are referred to as a first parity code and a second parity code.

The tensor symbols can be, for example, Reed-Solomon (RS) symbols, RS symbol combinations, or RS symbol splits. RS symbol combinations are combinations of RS symbols or combinations of RS symbols with extra bits. RS symbol splits are parts of split RS symbols.

Block 301 applies the inner component code (e.g., the first parity code) to the tensor symbol to generate syndromes for the bits in each sliding window. The syndrome values are intermediate values with respect to the composite code.

The syndrome values for the correct error event must form a codeword of the outer component code. Second level decoder 302 enforces the outer component code to generate a sequence of corrected syndrome values, such that each sequence of syndrome values forms a codeword of the outer component code.

Second level decoder 302 can apply a soft decoded error correcting code (such as LDPC code) to the soft information received from block 301. Soft decoded error correcting codes are error correcting codes that are decoded using symbol or bit soft (or reliability) information.

The second level decoder block 302 can be, for example, a message passing decoder for LDPC/Turbo codes. It can also be a trellis based Viterbi/BCJR decoder for short block codes, convolutional codes, or trellis coded modulation (for multiple TPP codes).

The error events output by block 301 can be grouped into sets, where each set has one error event for each span of the symbol. If such a set of error events has syndrome values that form a codeword of the outer component code, then that is a potentially valid set of error events.

The total error metric value for a potentially valid set of error events can be computed by combining the error metrics of each error event in the set. If the error metric values are logarithms of probabilities, the total error metric value for a potentially valid set of independent error events can be computed by adding together the error metrics for each error event in the set.

Second level decoder 302 selects the set of error events that has the minimum total error metric value among the potentially valid sets of error events. Second level decoder 302 outputs the syndrome values for that set of error events having the minimum total error metric value. These syndrome values are the corrected syndrome values.

The most likely tensor symbol for each error event output by block 301 is stored in buffer 303. The most likely tensor symbols can be generated by applying the most likely error events output by block 301 to the tensor symbol output by Viterbi detector 102.

Multiplexer 304 receives the corrected syndrome values from second level decoder 302 and selects the most likely tensor symbol from among the tensor symbols stored in buffer 303. The most likely tensor symbol corresponds to the error event having the smallest error metric value among the error events that have syndromes consistent with the corrected syndrome values.

The most likely tensor symbol is then transmitted to Reed-Solomon (RS) decoder 305. RS decoder 305 performs an additional level of error correction on the most likely tensor symbol using a well known RS decoding technique.

Figure 4:
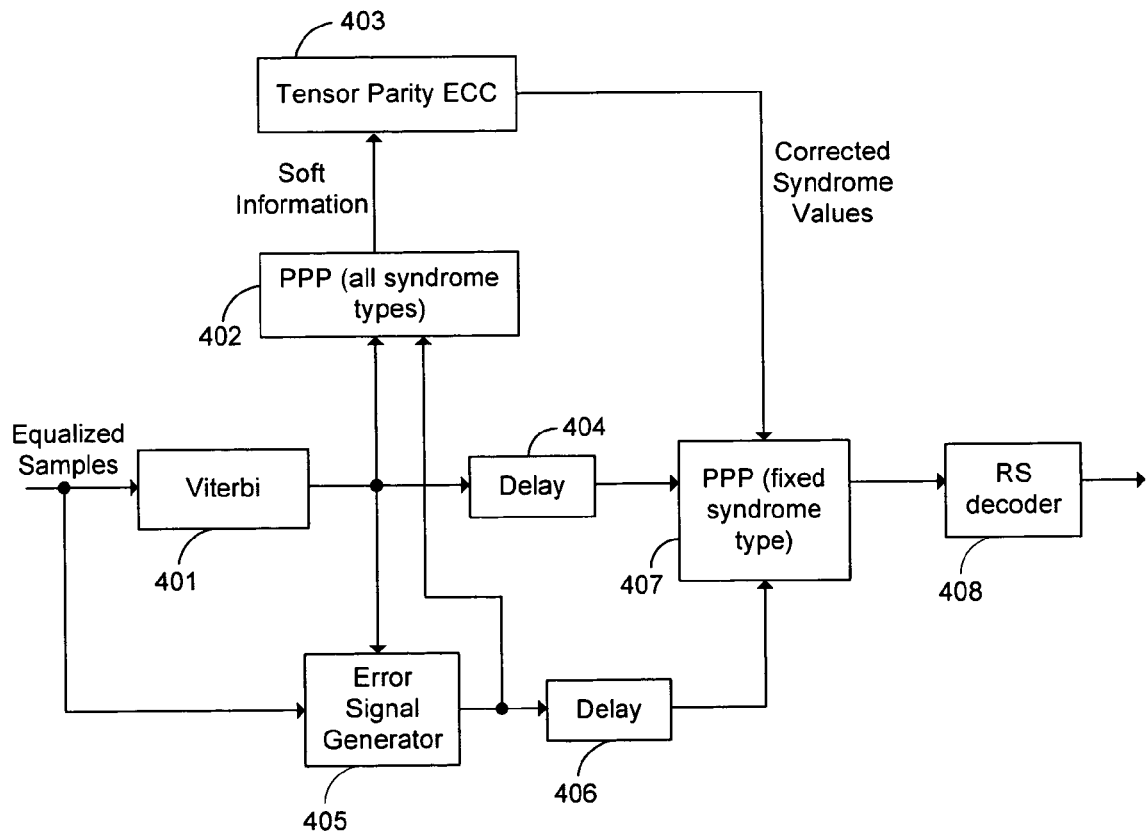
FIG. 4 illustrates a further example of a two level decoding system that processes soft information according to another embodiment of the present invention.

FIG. 4 illustrates another example of a two level decoding system that selects a most likely symbol corresponding to a most likely error event, according to alternative embodiment of the present invention. Equalized samples of signals read from a data recording medium (such as a magnetic hard disk) are input into Viterbi detector 401. Viterbi detector 401 selects the most likely trellis path for each symbol, as discussed above with respect to Viterbi detector 102.

Error signal generator 405 receives the equalized samples and the output of Viterbi detector 401. Error signal generator 405 performs the functions of delay 104, synthetic waveform generator 106, adder 108, and filter 110, described above. The outputs of error signal generator 405 are filtered sample error values that represent noise in the read sequence.

Parity post processor 402 receives the output of Viterbi detector 401 and the output of error signal generator 405. PPP 402 is a first level decoder. Blocks 112, 120, and 200 are an example of a parity post processor (PPP) 402. As described with respect to FIG. 2, PPP 402 also generates soft information including a most likely error event in each span for each syndrome value and error metric values corresponding to each most likely error event.

The soft information is transmitted to tensor parity error correction block 403. Block 403 is a second level decoder. Block 403 applies a soft decoded error correcting code (e.g., an LDPC) to generate corrected syndrome values using the soft information, as described above with respect to block 302.

A second parity post processor (PPP) 407 receives the corrected syndrome values from tensor parity ECC block 403. The second parity post processor 407 selects the error event that has the minimum error metric value among the valid-error events having syndromes that are consistent with the corrected syndrome values.

PPP 407 uses the selected error event to compute a corrected tensor symbol. The corrected tensor symbol is transmitted to RS decoder 408, which performs RS decoding on the corrected tensor symbol using well known RS decoding techniques.

Blocks 404 and 406 delay the outputs of Viterbi detector 401 and error signal generator 405, respectively, to account for the delay in PPP 402 and tensor parity ECC block 403. The delay provided by blocks 404 and 406 ensures that the symbols received from Viterbi detector 401 correspond in time with the corrected syndrome values output by tensor parity ECC block 403.

The advantage of the FIG. 4 embodiment is that there is no need to store the tensor symbols for all of the syndrome values in a buffer 303. However, the embodiment of FIG. 4 requires two parity post processors, instead of one. Using two PPPs may increase the latency time of the decoder.

The foregoing description of the exemplary embodiments of the invention has been presented for the purposes of illustration and description. It is not intended to be exhaustive or to limit the invention to the precise form disclosed. A latitude of modification, various changes, and substitutions are intended in the present invention. In some instances, features of the invention can be employed without a corresponding use of other features as set forth. Many modifications and variations are possible in light of the above teachings, without departing from the scope of the invention. It is intended that the scope of the invention be limited not with this detailed description, but rather by the claims appended hereto.

What is claimed is:

1. A data storage apparatus that decodes encoded data to perform error correction, wherein the data storage apparatus comprises:
    means for generating syndrome values for error events in an input sequence using a first error correction code;
    means for generating reliability information by selecting a most likely error event for each span of a symbol in the input sequence having a minimum error metric value among the error events that have a first syndrome value, and by selecting a most likely error event for each span of the symbol in the input sequence having a minimum error metric value among the error events that have a second syndrome value;
    means for applying a second error correction code to provide corrected syndrome values using the reliability information; and
    means for selecting a most likely symbol corresponding to an error event having a smallest error metric value among the error events having syndrome values consistent with the corrected syndrome values.

2. The data storage apparatus defined in claim 1 further comprising:
    means for generating error metric values each indicating a probability that a set of error values in the input sequence is caused by one of a set of error events.

3. The data storage apparatus defined in claim 1 wherein the means for generating syndrome values for error events in an input sequence using a first error correction code further comprises means for applying an inner component code of a composite error correction code to symbols in the input sequence.

4. The data storage apparatus defined in claim 3 wherein the means for applying a second error correction code to provide corrected syndrome values using the reliability information further comprises means for applying an outer component code of the composite error correction code to provide the corrected syndrome values using the reliability information.

5. The data storage apparatus defined in claim 1 further comprising:
    means for performing error correction on the most likely symbol using a Reed-Solomon decoding technique.

6. The data storage apparatus defined in claim 1 wherein the means for applying a second error correction code to provide corrected syndrome values using the reliability information further comprises means for applying one of a low density parity check code, a block parity code, a convolutional code, and a Turbo code to provide the corrected syndrome values using the reliability information.

7. The data storage apparatus defined in claim 1 wherein the means for applying a second error correction code to provide corrected syndrome values using the reliability information further comprises:
    means for grouping at least a subset of the most likely error events into potentially valid sets of the most likely error events such that each of the potentially valid sets of the most likely error events has one error event for each span of a symbol and each of the potentially valid sets of the most likely error events has syndrome values that form a codeword of the second error correction code; and means for selecting one of the potentially valid sets of the most likely error events that has a minimum total error metric value among the potentially valid sets of the most likely error events.

8. The data storage apparatus defined in claim 1 further comprising:

means for generating most likely symbols by applying the most likely error events to symbols in the input sequence, wherein the means for selecting a most likely symbol corresponding to an error event having a smallest error metric value among the error events having syndrome values consistent with the corrected syndrome values further comprises means for selecting the most likely symbol from among the most likely symbols such that the most likely symbol corresponds to an error event having a smallest error metric value among the error events having syndrome values consistent with the corrected syndrome values.

* * * * *